United States Patent
Mori et al.

[11] Patent Number: 5,179,034
[45] Date of Patent: * Jan. 12, 1993

[54] METHOD FOR FABRICATING INSULATED GATE SEMICONDUCTOR DEVICE

[75] Inventors: Mutsuhiro Mori; Tomoyuki Tanaka; Yasumichi Yasuda; Yasunori Nakano, all of Hitachi, Japan

[73] Assignee: Hitachi, Ltd., Tokyo, Japan

[*] Notice: The portion of the term of this patent subsequent to Jul. 16, 2008 has been disclaimed.

[21] Appl. No.: 683,695

[22] Filed: Apr. 11, 1991

Related U.S. Application Data

[63] Continuation of Ser. No. 233,007, Aug. 17, 1988, Pat. No. 5,032,532.

[30] Foreign Application Priority Data

Aug. 24, 1987 [JP] Japan .................. 62-208123

[51] Int. Cl.$^5$ ........................... H01L 21/70
[52] U.S. Cl. .......................... 437/41; 437/29; 437/40; 437/50; 437/160; 437/164; 437/228; 437/233; 437/235; 148/DIG. 126; 257/328
[58] Field of Search ............ 437/29, 40, 41, 50, 437/160, 161, 162, 164, 228, 233, 235; 357/23.4, 39; 148/DIG. 126

[56] References Cited

U.S. PATENT DOCUMENTS

| | | | |
|---|---|---|---|
| 3,907,617 | 9/1975 | Zwermemann | 437/164 |
| 4,209,350 | 6/1980 | Ito et al. | 437/164 |
| 4,417,385 | 11/1983 | Temple | 437/29 |
| 4,419,810 | 12/1983 | Riseman | 437/162 |
| 4,445,267 | 5/1984 | De La Moneda et al. | 437/41 |
| 4,466,176 | 8/1984 | Temple | 437/29 |
| 4,503,598 | 3/1985 | Vora et al. | 357/23.4 |
| 4,598,461 | 7/1986 | Love | 357/23.4 |
| 4,639,754 | 1/1987 | Wheatley | 357/23.1 |
| 4,691,435 | 8/1987 | Amantha et al. | 437/175 |
| 4,757,032 | 7/1988 | Contieno | 437/41 |
| 4,774,198 | 9/1988 | Contiero et al. | 357/23.4 |
| 4,775,879 | 10/1988 | Robb et al. | 357/23.1 |

FOREIGN PATENT DOCUMENTS

| | | |
|---|---|---|
| 010633 | 11/1978 | European Pat. Off. . |
| 083785 | 12/1981 | European Pat. Off. . |
| 0083816 | 7/1983 | European Pat. Off. . |
| 179407 | 10/1984 | European Pat. Off. . |
| 0115859 | 7/1983 | Japan ................. 437/41 |
| 61-156882 | 12/1984 | Japan . |
| 0156883 | 7/1986 | Japan . |
| 0046570 | 2/1987 | Japan . |
| 63-249374 | 4/1987 | Japan . |

*Primary Examiner*—Tom Thomas
*Attorney, Agent, or Firm*—Antonelli, Terry Stout & Kraus

[57] ABSTRACT

A method for fabricating an insulated gate semiconductor device comprises the steps of forming insulated gates on an n$^-$-layer surface, forming p-well layers in the n$^-$-layer using the insulated gates as masks, forming phosphosilicate glass layers on the side walls of the insulated gates and diffusing the impurities from the phosphosilicate glass layers into the p-well layers to form n$^{30}$-source layer.

9 Claims, 6 Drawing Sheets

METHOD FOR FABRICATING INSULATED GATE SEMICONDUCTOR DEVICE

This application is a continuation application of application Ser. No. 07/233,007, filed Aug. 17, 1988, now U.S. Pat. No. 5,032,532.

BACKGROUND OF THE INVENTION

The present invention relates to a method for fabricating a semiconductor device having an insulated gate (hereinafter referred to as an insulated gate semiconductor device), and more particularly to a method for fabricating such a device as is suitable to provide a high current density.

The semiconductor device to which the present invention relates has such a structure as shown in FIG. 5. In this figure, 11 is an n+-type or p+-type semiconductor substrate; 12 is an n−-type layer formed on the semiconductor substrate 11 and having a higher resistivity than the semiconductor substrate 11; 13 are a plurality of p+-type wells which extend into the n−-type layer 12 from the surface thereof on the side opposite to the side adjacent to the semiconductor substrate 11; 15 are n+-type sources which extends into the p+-well 13 from the surface thereof; 31 are gate electrodes each formed on the exposed portions of the n−-type layer 12 and p-type well 13 adjacent thereto through a gate oxide film 21; 22 are insulating films each formed so as to cover the gate electrode 31 and a part of the n+-type source layer 15 adjacent thereto; 41 is a drain electrode kept in ohmic contact with the surface of the semiconductor substrate 11 on the side opposite to the side adjacent to the n−-type layer 12; and 42 is a source electrode kept in ohmic contact with the exposed portions of the n+-source layers 15 and of the p-type wells 13 between the n+-source layers and formed so as to extend over the insulating films 22.

The semiconductor device as shown is an unipolar device commonly called "MOSFET" in the case where the semiconductor substrate 11 is of n+-type. In operation, if, with the source electrode 42 applied with e.g. 0V and the drain electrode 41 applied with a positive potential, a positive potential is applied to the gate electrode 31, an n-type inverted layer is produced in the p-type well layer 13 under the gate electrode 31 and electrons ⊖ flow to the drain electrode 41 through the source electrode 42, the n+-type source layer 15, the n-type inverted layer, the n−-type layer 12 and the n+-type substrate. Thus, current flows from the drain electrode 41 to the source electrode 42, whereby the semiconductor device turns on. Then, if the potential which has been applied to the gate electrode 31 is removed, the p-type inverted layer disappears. Thus, the path of electrons ⊖ is cut off whereby the semiconductor device turns off.

On the other hand, in the case where the semiconductor substrate 11 is of p+-type, the semiconductor device as shown is a bi-polar device called a conductivity-modulated MOSFET and IGBT (insulated gate bipolar transistor). In operation, potentials are applied to the source electrode 42 and the drain electrode 41 in the same manner as the case where the semiconductor substrate 11 is p+-type. Now, if a positive potential is applied to the gate electrode 31, electrons flow in the n−-type layer 12. Then, the electrons accelerate the injection of a large amount of holes from the p+-type substrate, thereby producing a large amount of excess carriers in the n−-type layer 12. Thus, the n−-type layer 12 which has been of a higher resistivity exhibits a conductivity of lower resistivity. This is the reason why that semiconductor device is called "conductivity modulated MOSFET", in which the electrons serve as a base current and a pnp transistor consisting of the p+-type substrate 11, the n−-type layer 12 and the p-type well layer 13 is operated. The injected holes flow into the source electrode 42 through the p-type well layer 13 under the n+-type source layer 15. In order to turn off the conductivity modulated MOSFET, the potential applied to the gate electrode 31 is removed as in the case of the unipolar MOSFET. Then, the path of electrons ⊖ is cut off so that the base current of the pnp transistor is not supplied. Thus, the holes are not injected whereby the current does not flow.

The semiconductor device having such a structure as described above has been proposed in U.S. Pat. No. 4,364,073, U.S. Pat. No. 4,587,713 and Solid State Electronics 28 No. 3 pp 389 to 297 (1985) "Temperature Behavior of Insulated Gate Transistor Characteristics" by B.J. Baliga, etc.

A process of fabricating such a semiconductor device as mentioned above will be explained with reference to FIGS. 6A to 6F. First, an n+-type or p+-type semiconductor substrate 11 is prepared and an n−-type layer 12 is formed on one surface thereof. A stack (insulated gate) of a gate oxide film 21 and a gate electrode 31 are selectively formed on the surface of the n−-type layer 12 on the side opposite to the side adjacent to the semiconductor substrate 11 (FIG. 6A). Using this stack as a mask, boron (B) is ion-implanted in the surface of the n−-type layer 12 where no mask is located thereon, and the substrate is heat-treated to form a p-type well layer 13 (FIG. 6B). A resist film 29 is formed on the p-type well layer 13 surface at the selected location thereof. Using, as a mask, this resist film and the stack of the gate oxide film 21 and the gate electrode 31, arsenic (As) or phosphorus (P) is ion-implanted in the p-type well layer 13 surface at the location where the mask is not present, (FIG. 6C). After the ion-implatation, the resist film 29 is removed and the substrate is heat-treated to form n+-type source layers 15 (FIG. 6D). An insulating film 22 is formed on the stack consisting of the gate oxide film 21 and the gate electrode 31 and on the exposed portions of the p-type well layer 13 and the n+-type source layer 15 (FIG. 6E). A portion of the insulating film 22 located on portions of the n+-type source layers and a portion of the p-type well layer 13 exposed between the n+-layer source layers 15 is selectively removed and a source electrode 42 is formed on the remaining insulating film 22 and on the portions of the n+-type source layers 15 and the p-type well layer 13 exposed by removing the portion of the insulating film 22 (FIG. 6F).

The insulating gate semiconductor device fabricated by the process as mentioned above has a disadvantage that it can not provide a high current density. The current density of the semiconductor device having an insulated gate as shown in FIG. 5 can be enhanced by providing a larger percentage area occupied by the gate region B in a device unit and a smaller percentage area occupied by the remaining region A. However, in the case where the semiconductor device is fabricated by the process as shown in FIGS. 6A to 6F, the area of the region A can not be decreased for the following reason. Namely, if an alignment accuracy of photolithography is 3 μm, size $A_1$ of the insulating film 22 required to insulate the gate electrode 31 from the source electrode 42, size $A_2$ required to surely bring the source electrode 42 and the n+-type layers 15 into contact with each other, and size $A_3$ required to separate the n+ layers 15 from each other and bring the p-type layer 13 and the source electrode 42 into contact with each other, which depends on the processing accuracy of the resist film 29, are required to be at least 3 μm. Since these sizes must take some allowance considering the safety rates, the entire width $(2A_1+2A_2+A_3)$ of the region A reaches 20 to 30 μm, which will occupy 50% of the device unit. Thus, the percentage of the gate region B can not be further increased, which makes it impossible to enhance the current density.

In the case of a conductivity modulated MOSFET using a p+-type substrate, if the width $(A_1+A_2)$ of the n+-type source layer 15 isis too large, injected holes ⊕ produce a voltage drop in the p-type well layer 13 due to the lateral resistance R in the p-type well layer 13 under the n+-type layer 15, thereby forward biasing the n+-type source layer 15 and the p-type well layer 13. Thus, an npn transistor consisting of the n+-type source layer 15, the p-type layer 13 and the n⁻-type layer 12 is started to operate, thus injecting electrons into the p-type well layer 13 from the n+-type source layer 15. Accordingly, the semiconductor device operates as a pnpn thyristor which includes the pnp transistor consisting of the layers 11, 12 and 13 as mentioned above, and is eventually latched up. Once latched up, the semiconductor device can not be turned off even when the potential applied to the gate electrode 31 is removed, which makes it impossible to control the semiconductor device through the gate.

Such a problem also occurs in the unipolar MOSFET when it shifts from the turn-on state thereof to the turn-off state thereof.

In order to surely operate the insulated gate semiconductor device, the parasitic transistor effect as mentioned above is desired to be made as small as possible.

SUMMARY OF THE INVENTION

An object of the present invention is to provide a method for fabricating an insulated gate semiconductor device having a high current density.

Another object of the present invention is to provide a method for fabricating an insulated gate semiconductor device having a high current density with high accuracy.

Still another object of the present invention is to provide a method for fabricating an insulated gate semiconductor device with a larger percentage of the area occupied by a gate region in a device unit.

A further object of the present invention is to provide an insulated gate semiconductor device with reduced parasitic bipolar transistor effect.

In order to attain these objects, the feature of the present invention resides in that a well layer and a source layer are positioned in a self-alignment manner by positioning an insulated gate. More specifically, the present invention is characterized by steps of selectively forming an insulated gate on the surface of a semiconductor substrate having one conductivity type, forming a well layer of the other conductivity type using the insulated gate as a mask, and forming an insulating film containing impurities of the one conductivity type on the side wall of the insulated gate and diffusing the impurities into the well layer to form source layers of the one conductivity type.

The other features of the present invention will become apparent from the following description of embodiments of the present invention taken in conjunction with the accompanying drawings.

DESCRIPTION OF THE PREFERRED EMBODIMENTS

The present invention will be explained with reference to the drawings which shows embodiments thereof.

Figure 1A:
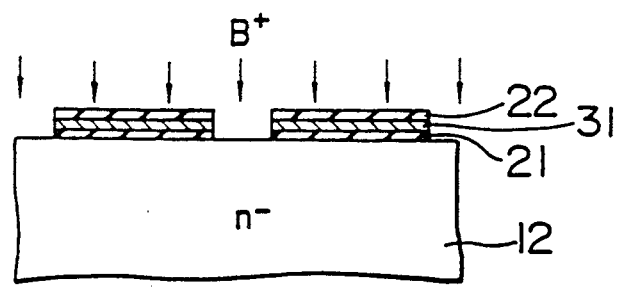
FIGS. 1A to 1F are a process flow diagram showing one embodiment of an insulated gate semiconductor device in accordance with the present invention.

FIGS. 1A to 1F show a typical embodiment of the present invention, which comprises the following steps (1) Stacks each consisting of three layers of a gate oxide film 21, a gate electrode 31 and an insulating film 22 is selectively formed on the surface of an n⁻-type layer 12. Using the stacks as a mask, p-type impurities, e.g. boron are ion-implanted in the exposed surface of the n⁻-type layer 12 (FIG. 1A). $SiO_2$ is used as the gate oxide film 21; impurity-doped poly-silicon is used as the gate electrode 31; and $SiO_2$ is used as the insulating film 22. The desired method of selectively forming the stack is to form the three-layer structure on the entire surface of the n⁻-type layer 12 and selectively etch it. Incidentally, as in the prior art, the n⁻-type layer 12 is formed on an n+ or p+-type semiconductor substrate 11.

Figure 1B:
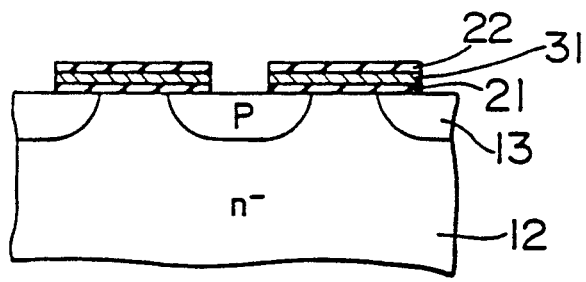

(2) The n⁻-type layer is heat-treated to activate and diffuse the ion-implanted boron, thereby forming p-type well layers 13 (FIG. 1B).

Figure 1C:
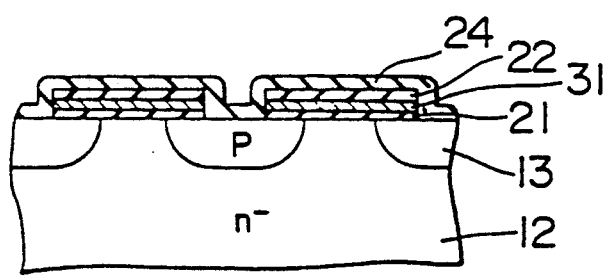

(3) A phosphosilicate glass layer 24 is formed on the entire exposed surface of the stacks and of the p-type well layer 13 (FIG. 1C). The phosphorus concentration in the phosphosilicate glass layer 24 is desired to exceed $1 \times 10^{19}$ atoms/cm³ for compensating for the concentration of the p-type well layers 13 and later forming n+-type source layers 15.

Figure 1D:
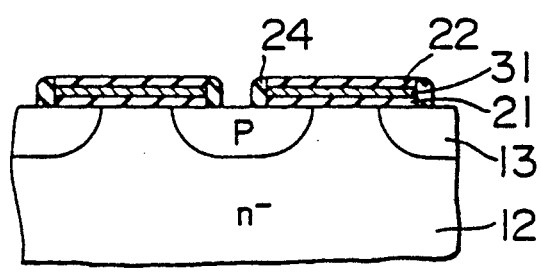

(4) The phosphosilicate glass layer 24 is dry-etched so that it is left on only the side walls of the stacks and the remaining portion thereof is completely removed (FIG. 1D). The dry etching adopted in this embodiment is an anisotropic dry etching.

Figure 1E:
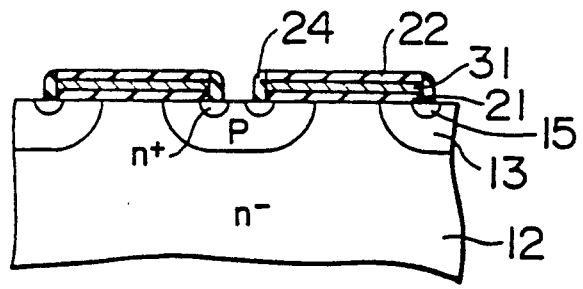

(5) The resultant structure is heat-treated to diffuse the phosphorus contained in the phosphosilicate glass 24 left on the side walls of the stacks into the p-type well layers 13, thereby forming n+-type source layers 15 (FIG. 1E). The heat treatment is performed at the temperature of approximately 1000° C. for the period which is decided in accordance with the selected depth of the n+-type source layers 15.

Figure 1F:
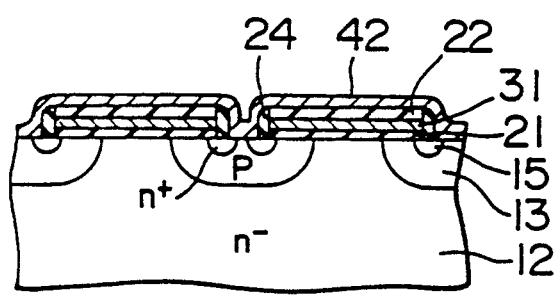

(6) Thereafter, a source electrode 42 is formed on the stacks, the remaining glass layers 24 and the exposed surface of the n+-type source layers 15 and the p-type well layers 13 (FIG. 1F).

Figure 2:
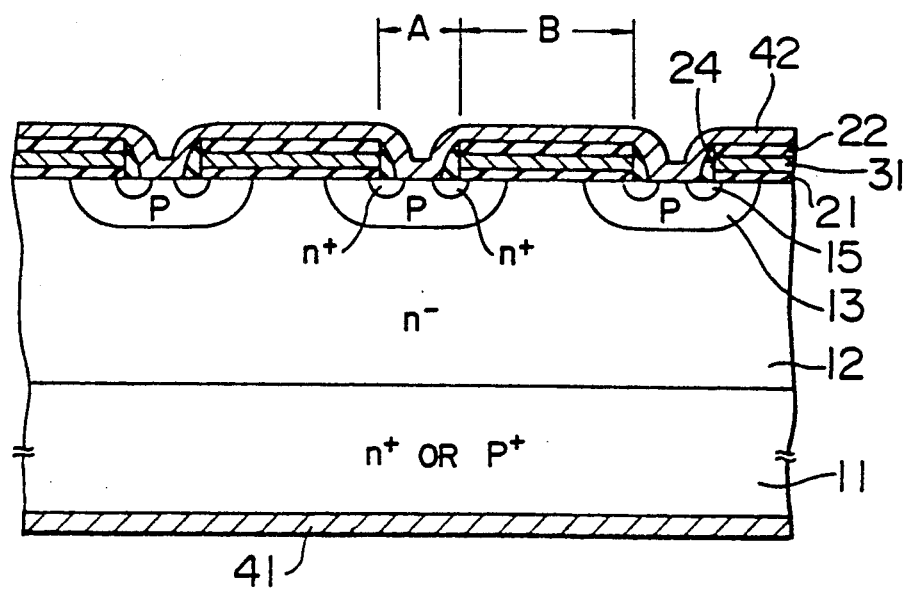
FIG. 2 is a schematic sectional view of the insulated gate semiconductor device fabricated by the process shown in FIG. 1.

Thus, the insulated gate semiconductor device having such a structure as shown in FIG. 2 is obtained.

Figure 5:
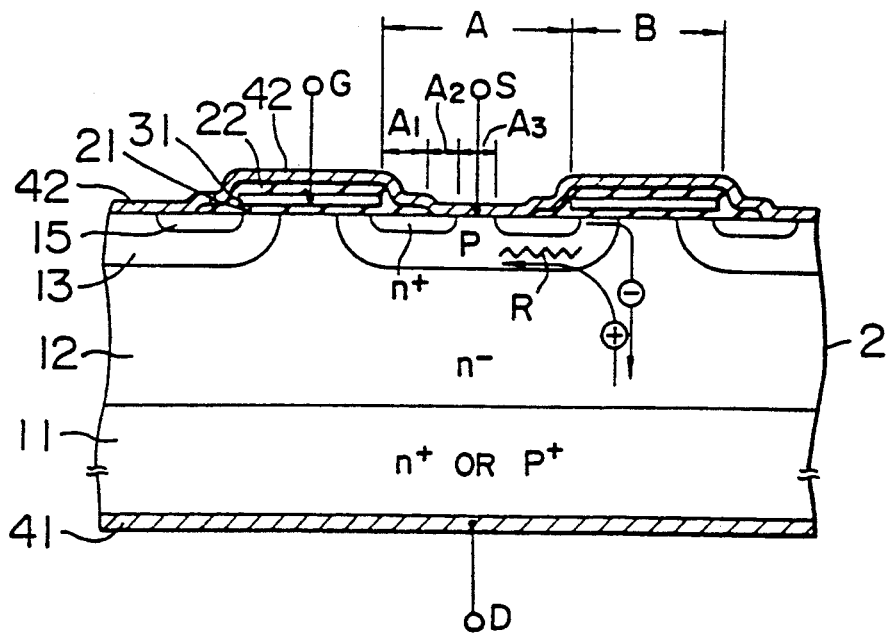
FIG. 5 is a schematic sectional view of an insulated gate semiconductor device according to the prior art.
Figure 6A:
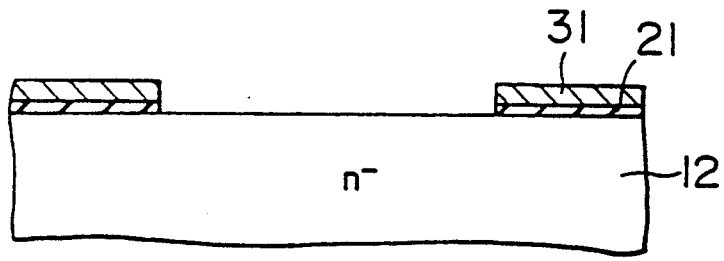
FIGS. 6A to 6F are a process flow diagram for explaining the insulated gate semiconductor device shown in FIG. 5.
Figure 6B:
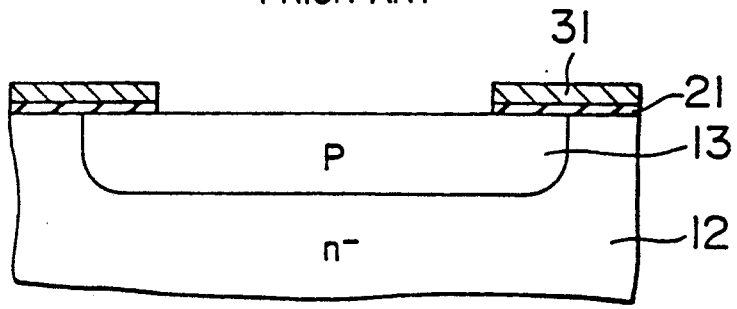
Figure 6C:
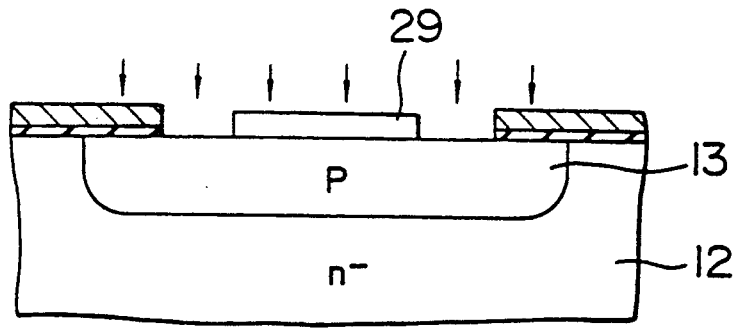
Figure 6D:
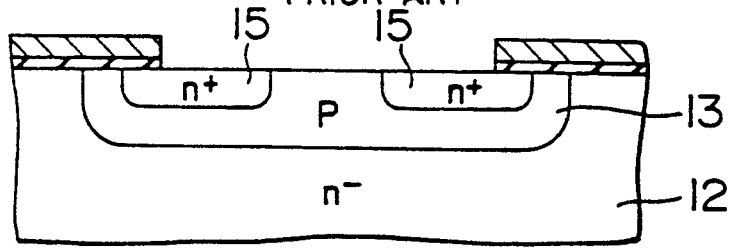
Figure 6E:
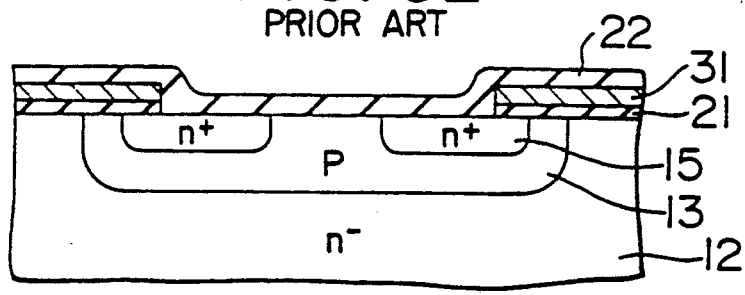
Figure 6F:
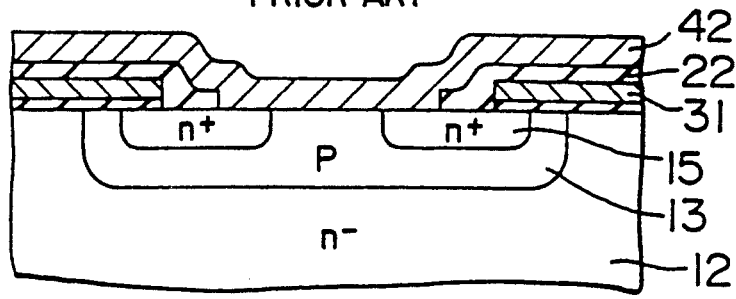

In the fabricating process as mentioned above, the step of leaving the phosphosilicate glass film 24, which is a diffusion source for the n+-type source layers 15, on the stacks of three layers consisting of the gate oxide film 21, the gate electrode 31 and the insulating film 22 which are used as masks in forming the p-type well layers 13, serves to form contact holes for the source electrode 42. Therefore, the p-type well layers 13, the n+-type source layers 15 and the contact areas for the source electrode 42 can be formed in a self-alignment manner. In forming the n+-type source layers 15 and the contact areas for the source electrode 42, it is not necessary to consider the mask alignment accuracy. Thus, the size $A_1$ shown in FIG. 5 can be controlled to the maximum thickness of the phosphosilicate glass film 24 on the side wall of the stack and the size $A_2$ can be controlled at high accuracy in the diffusion in the direction in parallel to the surface of the n+-type source layers 15 so that the size $A_3$ can be made very small. More concretely, in the processing rule of 3 $\mu$m, i.e. when the required size A is 3 $\mu$m, size $A_1$ can be controlled to 0.5 $\mu$m, size $A_2$ can be controlled to 0.5 $\mu$m and size $A_3$ can be controlled to 1 $\mu$m. The area corresponding to size A can be greatly reduced (approximately $\frac{1}{3}$) as compared with the prior art. Thus, the percentage of the area of the gate region corresponding to size B in a device area unit can be greatly increased. Correspondingly, the current density can made much larger (more than 1.5 times) than the prior art.

The insulated gate semiconductor device fabricated by the process mentioned above can provide a small width of the n+-type source layer 15 so that the lateral resistance in the p-type well layer 13 immediately thereunder can be reduced. Thus, the undesired parasitic bipolar transistor effect can also be greatly reduced. More specifically, in the unipolar MOSFET, the operation of the parasitic transistor constituted by the n+-type source layer 15, the p-type well layer 13 and the n−-type layer 12, which will occur when the MOSFET shifts the turn-on state to the turn-off state, can be restrained. In the conductivity modulated MOSFET, its latch-up can be prevented.

Figure 3A:
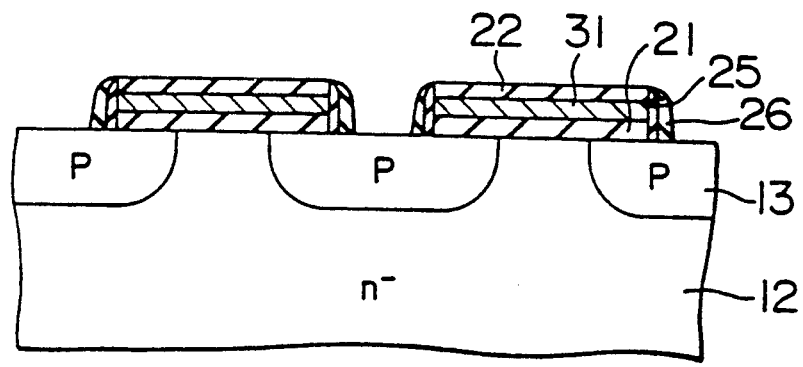
FIGS. 3A and 3B are schematic sectional views for explaining the other embodiment of the present invention.
Figure 3B:
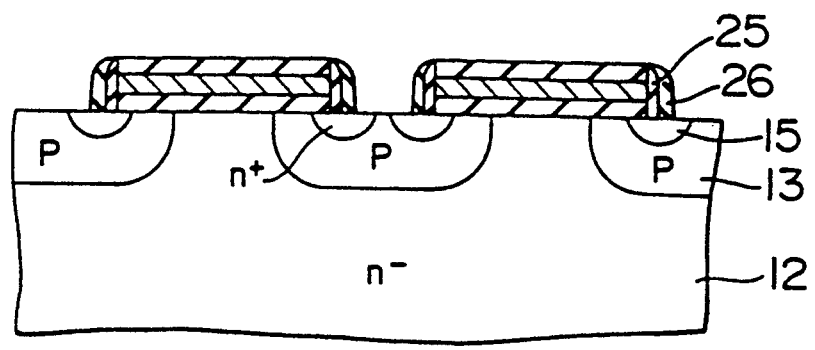

FIGS. 3A and 3B show parts of the fabrication process in accordance with another embodiment of the present invention. This embodiment is different from the embodiment of FIGS. 1A to 1F in that films 26 containing impurities (doped films) are formed, through insulating films 25 not containing impurities (undoped insulating films), on the stacks each consisting of three layers of the gate oxide film 21, the gate electrode 31 and the insulating film 22. FIG. 3a shows the step of forming the insulating film 25 and the film 26 on each of the side walls of the stack. FIG. 3B shows the step of forming the n+-type source layers 15 by diffusing the impurities in the films 26 into the p-type well layers 13 through heat treatment. The insulating film 25 and the film 26 can be formed on the side wall of the stack by forming the undoped insulating film 25 on the entire surface of the stacks and the exposed portions of the p-type well layers 13, anisotropic-dry-etching it, further forming the doped film 26 on the entire surface of the resultant structure and anisotropic-dry-etching it. $SiO_2$ can be used as the undoped insulating film 25 and phosphosilicate glass or doped poly-silicon can be used as the doped film 26.

In this embodiment, the undoped insulating film 25 is located between the gate electrode 31 and the source electrode 42 so that both electrodes can be surely insulated from each other. Also, the doped film 26 which serves as a diffusion source 15 for the n+-type source layer 15 is not required to be electrically insulative so that the conductor such as doped poly-silicon can be used, which assures that the n+-type source layers 15 and the source electrode 42 are kept in contact with each other.

Figure 4A:
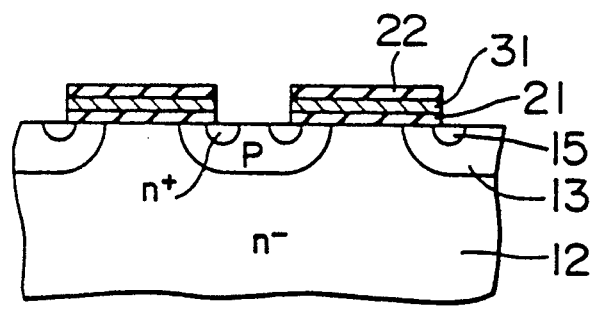
FIGS. 4A to 4C are a process flow diagram for explaining a further embodiment of the present invention.
Figure 4B:
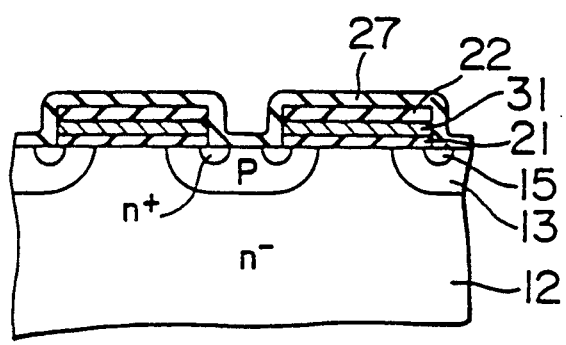
Figure 4C:
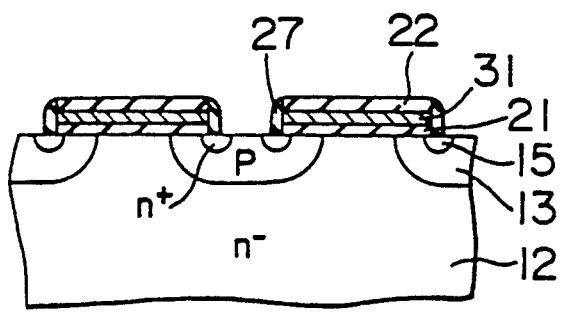

FIGS. 4A to 4C are parts of the fabricating process in accordance with still another embodiment of the present invention. This embodiment is different from the embodiment of FIG. 1A to 1F in that the phosphosilicate glass film 24 on each of the side walls of the stack is removed after the n+-layer 15 is formed, and an undoped film 27 is newly formed on each of the side walls of the stack. FIGS. 4A to 4C show a film replacing process on the side wall of the stack.

FIG. 4A shows a step subsequent to the step of FIG. 1E, in which the phosphosilicate glass layer 24 is removed. If the insulating film 22 is made of SiN and the gate electrode 31 is made of Si, this phosphosilicate glass 24 can preferably etched through an etching process using a solution of hydrogen fluoride.

FIG. 4B shows a step of forming an insulating film 27, which is completely undoped or slightly doped, on the entire surface of the stacks and the exposed portions of the p-type well layers 13.

FIG. 4C shows a step of leaving the insulating film 27 on only the side walls of the stacks by on anisotropic-dry-etching.

In this embodiment, the undoped or only slightly doped insulating film 27 is located between the gate electrode 31 and the source electrode 42 so that the reverse blocking capability thereacross can be enhanced. Further, by forming the insulating film 27 having a thickness that is smaller than that of the phosphosilicate glass layer 24, the source electrode 42 and the n+-type source layers can be surely kept into contact with each other.

Although an n-channel MOSFET has been adoped in the above explanation relative to the several embodiments of the present invention, the present invention can also provide the same effects when it is a p-channel MOSFET.

As explained above, in accordance with the present invention, (1) an insulated gate semiconductor device which operates at high current densities can be fabricated at high accuracy, and (2) an insulated gate semiconductor device less influenced from the parasitic bipolar transistor effect can be obtained.

We claim:

1. A method for fabricating insulated gate semiconductor devices comprising the steps of:
    forming a plurality of insulated gates, each consisting of three layers of a gate oxide film, a gate electrode and an insulating film, at predetermined intervals on the surface of a semiconductor layer of a first conductivity type;
    after forming the plurality of insulated gates having the gate oxide film, the gate electrode and the insulating film, forming well layers of a second conductivity type opposite the first conductivity type in the semiconductor layer using the insulated gates as masks, said well layers each having a higher impurity concentration than that of the semiconductor layer;

forming, on an insulator film located only on the side walls of each of the insulated gates in regions between the insulated gates, films doped with impurities of the first conductivity type in regions between the insulated gates;

diffusing the impurities from the films doped with the first conductivity type impurities into the well layers to form source layers each having the first conductivity type and a higher concentration than that of the well layers; and forming a source electrode kept in ohmic contact with the exposed portions of the source layers and the well layers and extended over the insulated gates.

2. A method according to claim 1, wherein the films doped with impurities of the first conductivity type are made of doped polycrystalline silicon.

3. A method according to claim 1, wherein said insulator film is undoped.

4. A method according to claim 3, wherein the undoped insulator film is made of $SO_2$.

5. A method according to claim 3, wherein the films doped with impurities of the first conductivity type are made of a material selected from the group consisting of phosphosilicate glass and doped polycrystalline silicon.

6. A method for fabricating an insulated gate semiconductor device comprising the steps of:
forming a plurality of insulated gates, each consisting of three layers of a gate oxide film, a gate electrode and an insulating film, at predetermined intervals on the surface of a semiconductor layer of a first conductivity type, with the gate electrode between the gate oxide film and the insulating film;

after forming the insulated gates having the gate oxide film, the gate electrode and the insulating film, forming a plurality of well layers of a second conductivity type opposite the first conductivity type in the semiconductor layer using the insulated gates as masks, said well layers each having a higher impurity concentration than that of the semiconductor layer;

forming an insulating film on the entire surface of the insulated gates and the well layers;

removing said insulating film by anisotropic-dry-etching so that a remaining portion thereof is left on only the side walls of the insulated gates in regions between the insulated gates;

forming a doped film on the entire surface of the insulated gates and well layers;

removing said doped film by anisotropic-dry-etching so that a remaining portion of the doped film is left on only the side walls of the insulated gates in regions between the insulated gates;

diffusing the impurities from the remaining portion of the doped film on the side walls of the insulated gates into the well layers to form source layers each having the first conductivity type and a higher concentration than that of the well layers; and forming a source electrode in ohmic contact with exposed portions of the source layers and the well layers, and extending over the insulated gates.

7. A method according to claim 6, wherein said insulator film is undoped.

8. A method for fabricating an insulated gate semiconductor device comprising the steps of:
forming a plurality of insulated gates, each consisting of three layers of a gate oxide film, a gate electrode and an insulating film, at predetermined intervals on the surface of a semiconductor layer of a first conductivity type;

after forming the insulated gates having the gate oxide film, the gate electrode and the insulating film, forming a plurality of well layers of a second conductivity type opposite the first conductivity type in the semiconductor layer using the insulated gates as masks, said well layers each having a higher impurity concentration than that of the semiconductor layer;

forming an insulator film on the entire surface of the insulated gates and the well layers;

removing said insulator film by anisotropic-dry-etching so that it is left on only the side walls of the insulated gates in regions between the insulated gates;

forming a doped film on the entire surface of the insulated gates and the well layers;

removing said doped film by anisotropic-dry-etching so that a remaining portion of the doped film is left on only the side walls of the insulated gates in regions between the insulated gates;

diffusing the impurities from the remaining portion of the doped film, on the side walls of the insulated gates, into the well layers to form source layers each having the first conductivity type and a higher concentration than that of the well layers; and forming a source electrode kept in ohmic contact with the exposed portions of the source layers and the well layers and extended over the insulated gates.

9. A method according to claim 8, wherein said insulator film is undoped.

* * * * *